US006468346B2

(12) United States Patent
Arnowitz et al.

(10) Patent No.: US 6,468,346 B2
(45) Date of Patent: Oct. 22, 2002

(54) APPLYING X-RAY TOPOGRAPHY AND DIFFRACTOMETRY TO IMPROVE PROTEIN CRYSTAL GROWTH

(75) Inventors: Leonard Arnowitz, Chevy Chase; David R. Black, Brookeville; D. Travis Gallagher, Potomac, all of MD (US)

(73) Assignee: BSI Proteomics Corporation, Gaithersburg, MD (US)

( * ) Notice: Subject to any disclaimer, the term of this patent is extended or adjusted under 35 U.S.C. 154(b) by 0 days.

(21) Appl. No.: 09/733,068

(22) Filed: Dec. 11, 2000

(65) Prior Publication Data

US 2002/0100411 A1 Aug. 1, 2002

Related U.S. Application Data

(60) Provisional application No. 60/169,943, filed on Dec. 10, 1999.

(51) Int. Cl.[7] .................................................. C30B 7/14
(52) U.S. Cl. .......................................... 117/68; 117/901
(58) Field of Search .................................... 117/68, 901

(56) References Cited

PUBLICATIONS

"Applying X–Ray Topography and Diffractometry to Improve Protein Crystal Growth," David Black, et al. (Presented at AIP Conference, Albuquerque, New Mexico, Feb. 2000).
"Macromolecular Impurities and Disorder in Protein Crystals," C.L. Caylor, et al., *Proteins: Structure, Function, and Genetics*, 36:270–281 (1999).
"CCD Video Observation of Microgravity Crystallization of Lysozyme and Correlation with Accelerometer Data," E.H. Snell, et al., *Acta Crystallographica*, D53:747–755 (1997).
"Repartitioning of NaCl and Protein Impurities in Lysozyme Crystallation," Peter G. Vekilov, et al., *Acta Crystallographica*, D52:785–798 (1996).
"X–ray Topographic Studies of Protein Crystal Perfection and Growth," I. Dobrianov, et al., *Acta Crystallographica*, Section D54:922–937 (1998).
"Investigating The Influence Of Growth Conditons On Protein Crystal Perfection," as displayed on Internet URL: http://www.nsls.bnl.gov/BeamRD/LiteBites/Siddons/Siddons1.html on Dec. 6, 2000.
"Imaging Impurities and Impurity–Induced Disorder in Protein Crystals," C.L. Caylor, et al., as displayed on Internet URL: http://www.people.cornell.edu/pages/clc21/poster99/poster99.html on Dec. 6, 2000.
"Disorder in Protein Crystals," Cornell University, as displayed on Internet URL: http://www.msc.cornell.edu/~robt/proteinoverview.html on Dec. 6, 2000.
X–Ray Diffraction Topography, B.K. Tanner, *International Series in the Science of the Solid State*, vol. 10, Pergamon International Library, Oxford, UK (1976) pp. ix–xiii, 24–62, 100–144.
"High Resolution X–ray Diffractometry and Topography," D. Keith Bowen, et al., Taylor & Francis, London, UK (1998) pp. v–vii, 1–49, 69–105, 172–206.

*Primary Examiner*—Felisa Hiteshew
(74) *Attorney, Agent, or Firm*—Richard C. Litman

(57) ABSTRACT

This invention is a method for identifying conditions for growing protein crystals giving improved protein crystal growth. Crystals of a protein are grown under different sets of predetermined conditions, and x-ray topographic images of the protein crystals are generated to identify the set(s) of conditions that produce crystals having the fewest crystal defects. In a preferred embodiment, the protein crystals are grown in a dynamically controlled crystallization system. An important condition of crystal growth that can be optimized by the method of the invention is the effective gravity, $g_{eff}$, experienced by the growing crystal; for example, when the crystal is grown in a powerful magnetic field that causes the protein molecules in the growing crystal to experience acceleration of an effective gravitational field that is greater or less than the actual gravitational field at the earth's surface. The method further includes using x-ray crystallography to solve the structure of the protein in a crystal found by x-ray topography to have fewer defects.

29 Claims, 5 Drawing Sheets

$F_m = (1/\mu)\, M\, \Delta B/\Delta_z$
$= (\chi/\mu)\, V\, B\, \Delta B/\Delta_z$ $F_g = mg = \rho V g$

B

LEVITATION WHEN $F_g = F_m$

OR $[\rho/\chi]\,[g\mu] = B\, \Delta B/\Delta_z$

LEVITATION WHEN $F_g = F_m$

OR $[\rho/\chi]\ [g\mu] = B\ \Delta B/\Delta_Z$

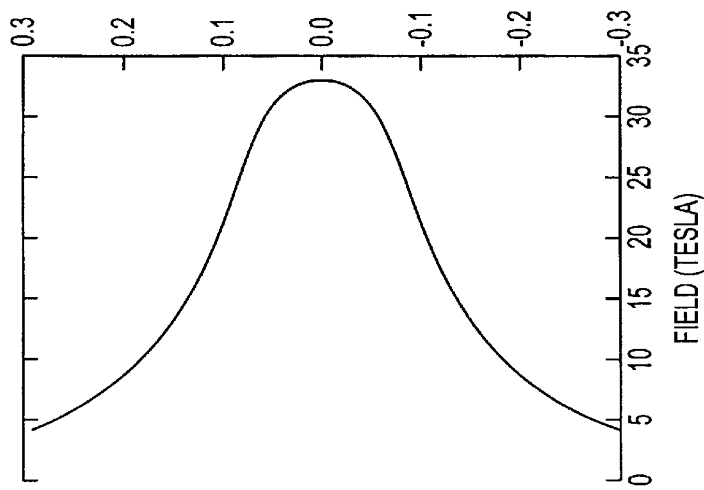
FIG. 3c
33 TESLA MAGNET BORE
FIG. 3b
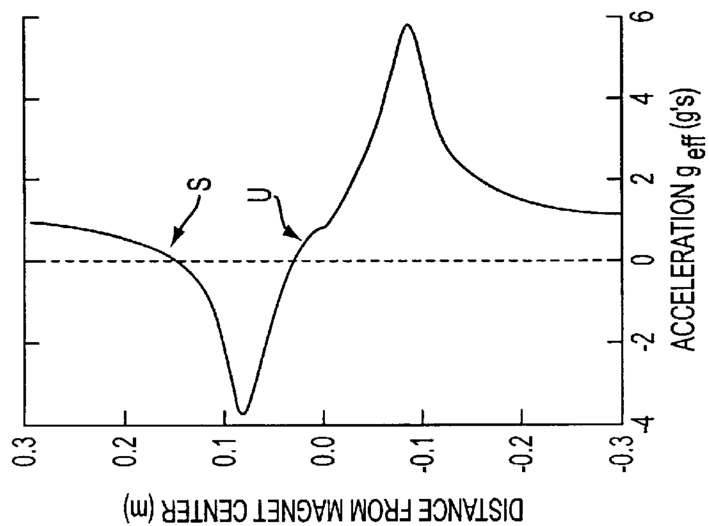
FIG. 3a

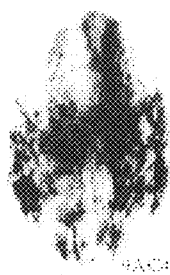
FIG. 4A
FIG. 4B
FIG. 4C
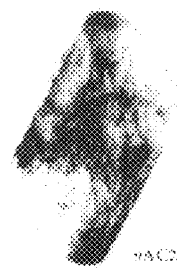
FIG. 4D
FIG. 4E
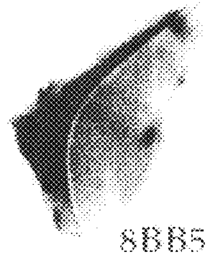
FIG. 4F
FIG. 4G
FIG. 4H
FIG. 4I
FIG. 4J
FIG. 4K

APPLYING X-RAY TOPOGRAPHY AND DIFFRACTOMETRY TO IMPROVE PROTEIN CRYSTAL GROWTH

CROSS-REFERENCES TO RELATED APPLICATIONS

This application claims the benefit of the filing date of the U.S. provisional application No. 60/169,943, filed Dec. 10, 1999, entitled "Molecular Crystallization With Magnetic Levitation," which is incorporated herein by reference in their entirety.

BACKGROUND OF THE INVENTION

1. Field of the Invention

This invention relates to methods in which x-ray topographic images of protein crystals are made and analyzed to identify conditions for growing protein crystals having greater order and fewer crystal defects that are suitable for use in determining the structure of the protein by x-ray diffractometry (crystallography).

2. Description of Related Art

X-ray topography is a well-established technique for characterizing and studying, by means of x-ray diffraction, the defect microstructure of single-crystals. Historically, the technique has largely been used to detect defects in inorganic crystalline structures (Bowen, 1998 and Tanner, 1976). More recently, x-ray topography has been employed to detect imperfections in protein crystals (for example, see Caylor et al., 1999).

The present invention fulfills a long-felt need for improved methods for producing good-quality protein crystals, by providing methods in which x-ray topographic analysis is systematically applied to identify conditions giving improved crystal growth. Of particular importance, the present invention uses x-ray topographic analysis in conjunction with two powerful, new methods for producing high-quality protein crystals—the use of dynamically controlled crystallization for crystallizing proteins, and the crystallization of proteins at effective gravity geff that is different from gravity at the earth's surface.

The former approach involves crystallizing protein using a dynamically controlled crystallization system (DCCS) having a crystallization chamber that contains the protein in a buffered solution separated from the precipitating solution by a dialysis type membrane. A computer-controlled mechanism gradually changes the precipitating solution strength in a very precisely controlled manner, thereby causing the protein to leave its solution, form aggregates, nucleate, and initiate crystal growth.

The latter approach can be accomplished by growing the crystals in space, or in a magnetic field that causes the protein molecules in the crystal to experience an effective gravitational field that is greater or less than the gravitational field at the earth's surface.

BRIEF SUMMARY OF THE INVENTION

The present invention provides a general method and system for identifying conditions for growing protein crystals having greater order and fewer crystal defects that are suitable for use in determining the structure of the protein by x-ray crystallography (diffractometry). Crystals of a protein are grown under different sets of predetermined conditions, and x-ray topographic images of the protein crystals are generated. The x-ray topographic images reveal defects in the crystals, and permit identification of the set(s) of conditions that produce crystals having the fewest crystal defects. In a preferred embodiment, the protein crystals are grown in a dynamically controlled crystallization system (DCCS). An important condition of crystal growth that can be optimized by the method is the effective gravity, $g_{eff}$, experienced by the growing crystal; for example, when the crystal is grown under microgravity in space, or in a powerful magnetic field that causes the protein molecules in the growing crystal to experience acceleration of an effective gravitational field that is greater or less than the actual gravitational field at the earth's surface. With the present method, it is possible to identify differences between crystals grown on the earth with the DCCS, and those grown in space under identical conditions. A comparison of x-ray topographs taken from both earth grown and space grown crystals indicates that the space grown crystals are of higher crystallographic perfection. X-ray topography can similarly be used to identify a condition of effective gravity $g_{eff}$ within a magnetic field that is less than the gravitational field at the earth's surface at which a protein crystal having fewer defects can be grown.

The method of the present invention thus comprises identifying conditions at which a protein crystal having the fewest defects can be grown, growing a protein crystal under those conditions, and subjecting such a crystal to x-ray crystallography to solve the structure of the crystallized protein, with the result that the structure so obtained is more accurate than the structure that would be obtained from a crystal having more defects.

BRIEF DESCRIPTION OF THE FIGURES

FIG. 3—Magnetic levitation environment for a water sample at 33 T. (a)—Effective gravitational acceleration $g_{eff}$, (b)—magnet bore profile, and (c)—magnetic field value for a 33 T, 32 mm bore resistive magnet. Position of growth cells is represented schematically, placed along the central axis of the magnet. Orientation is vertical: negative $g_{eff}$ means an upwards force, positive $g_{eff}$ means downwards. The parameters have been computed for the magnet at full field. The purpose of this is to show that $g_{eff}$ values ranging from zero to 6 g are accessible in high fields. Note that there are two $g_{eff}=0$ locations. S is a stable point where objects will "float", and U is an unstable point where the object will fall. The maximum amplitude in $g_{eff}$ shown in (a) will decrease as the maximum field decreases until at some point $g_{eff}$ will always be positive (around 16 T). The shape of the $g_{eff}$ profile vs. height will not change, however. NOTE: the example of 33 T is to show the maximum variation Of $g_{eff}$ available presently. The proposed experiments will be carried out in the range zero to 2 g at 16 T unless early results indicate that a larger value of g emerges as a potentially important parameter.

FIGS. 4A–4K: (006) x-ray diffraction topographs of 5 space-grown crystals: 9AC4 (FIG. 4A), 9AC1 (FIG. 4B), 9AA1 (FIG. 4C), 9AC2 (FIG. 4D), and 8AC2 (FIG. 4E); and 5 earth-grown crystal: 8BB5 (FIG. 4F), 8BC1 (FIG. 4G), 8BB6 (FIG. 4H), 8BA1/grain 1 (FIG. 4I), 8BA2 (FIG. 4J), and 8BA1/grain 2 (FIG. 4K). The projection of the diffraction vector is vertical, and, therefore, the c-axis of the samples is also vertical. The image of space-grown crystal 9AC1 shows a symmetry about the vertical and horizontal axes consistent with growth sectors. As the Bragg angle is changed, the four dark regions indicated migrate together toward or away from the center of the crystal, consistent with a central nucleation point followed by homogeneous growth. Earth-grown crystal 8BA1 is actually a bicrystal with the two grains misoriented by 220 seconds of arc.

DETAILED DESCRIPTION OF THE INVENTION

Figure 1:
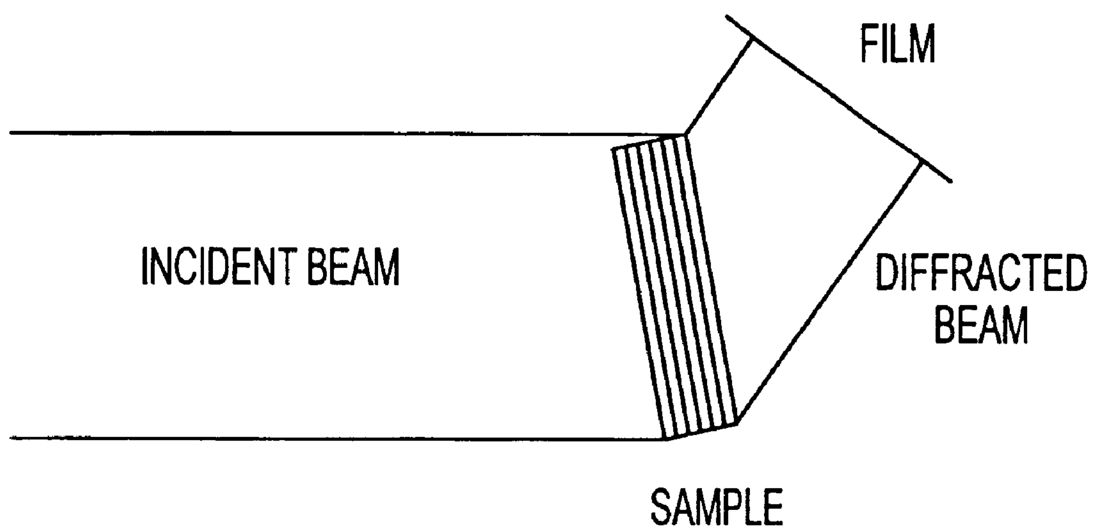
FIG. 1—Illustration of basic principle of diffraction topography.

Unless defined otherwise, all technical and scientific terms used herein have the same meaning as commonly understood by one of ordinary skill in the arts to which this invention belongs. While the preferred methods and materials are described, it is envisioned that methods and materials similar or equivalent to those described herein can also be used in the practice or testing of the present invention.

Protein Crystallization

Protein crystals provide the key, through x-ray crystallography or diffractometry, to detailed structural knowledge about the crystallized proteins. Accordingly, the possibility of using the microgravity environment of space to grow superior crystals of protein, DNA, and RNA has motivated extensive scientific research and commercial interest. Any method that helps grow better crystals could be important to our understanding of biochemical interactions. The increasing pace with which this knowledge is being applied to invent molecular therapies and cures for human diseases, provides additional incentive for crystallization research. Despite its increasing importance in medicine, protein crystal growth is still not well understood, and it is nearly impossible to predict the conditions under which a new protein will crystallize. Even in well-studied systems results are often difficult to reproduce and explain. This is because protein crystal growth involves the formation of billions of weak interactions among molecules whose surfaces are complex and asymmetric. Features of the chemical and physical environment, particularly the chemical properties of the fluid and the temperature, promote the weak interactions in ways that are not yet predictable by standard chemical models.

Crystallization is affected by gravity through the physical phenomena of sedimentation and convection. Sedimentation refers to the tendency of heavy things to fall or sink. Protein crystals are about half water, but still are generally more dense than the solutions from which they grow, and so tend to sediment in earth's gravity, along with any dust and amorphous precipitate. Crystals frequently grow stuck to the bottom of their growth chamber as a consequence of sedimentation, which makes harvesting them difficult.

Convection is a term for the circulation of fluid caused by the motion of lighter and heavier parts of the crystallization solution. In the area around a growing crystal, the solution becomes depleted of protein and consequently lighter, so it rises. This creates a current that constantly rises past the crystal, similar to the air currents around a candle flame. The phenomena of sedimentation and convection are absent in a zero-gravity environment.

In order to obtain diffraction data of sufficient quality to enable determination of the structure of the protein of interest, it is important that a crystal be of good quality. Although in this context there may be no single concise definition of quality, it must involve adequate size, singleness (ideally the crystal comprises a single molecular lattice), and several diffraction criteria. Diffraction is key to the crystal's usefulness, and disorder in the protein crystal affects the diffraction pattern by reducing the resolution and increasing the mosaicity—a term related to the presence of regions within the crystal having slightly different orientations. Resolution and mosaicity are the two best estimators of diffraction quality.

X-ray Topography

The present invention uses X-ray topography to further evaluate and compare the quality of the crystals grown in microgravity. X-ray topography is a well-established characterization technique for studying, by means of x-ray diffraction, the defect microstructure of single-crystals (Bowen, 1998 and Tanner, 1976). The basis for the technique is that the diffracted intensity from any point in a sample is determined by the local crystal perfection at that point. In other words, the intensity diffracted from a perfect region of the sample will be different than that from an imperfect region. Imperfect regions exist around crystallographic defects such as dislocations, stacking faults, inclusions and voids, and also result from long-range inhomogeneous strain. If we record the spatial distribution of diffracted intensity from the sample we then have a map of the distribution of defects and strain. This map is the topograph. The experimental geometry for recording a topograph is shown in FIG. 1. In the preferred embodiment, the sample crystal is illuminated by a monochromatic x-ray beam generated by a synchrotron radiation facility. A specific set of crystallographic planes is selected and oriented with respect to the incident beam at the Bragg angle according to the equation (Cullity, 1967):

$$E=hc/2d\sin\Theta$$

where E is the incident x-ray energy, h is Plank's constant, c the speed of light, d the lattice spacing of the selected set of planes and Θ defines the Bragg angle. The diffracted beam is then recorded on high-resolution film and/or viewed in real time on x-ray sensitive video cameras. Synchroton-generated white-beam x-rays, and characteristic radiation from a standard laboratory x-ray source can also be used to produce topographic images of crystals; however, lowest exposure times and highest-quality data are generally obtained using a synchroton-generated, monochromatic x-ray beam.

The x-ray topographs of protein crystals will reveal the spatial distribution of lattice defects and misorientation throughout the volume of the crystal. Typical defects observed by topography include dislocations, subgrain boundaries, and impurity concentration variations. Examples of topographs from ribonuclease crystals are shown in FIG. 4. The images on the left are from crystals grown in a microgravity environment and those on the right are from terrestrial crystals grown under otherwise identical conditions. The microgravity images are sharper and more uniform. When the diffracted microgravity image is observed in real time as the Bragg angle is rotated, the image changes in a way consistent with a nucleation in the center of the crystal followed by homogeneous growth (see 9AC1). The terrestrial crystal images are more diffuse, and 8BA1 shows a subgrain with a misorientation of 0.061°.

Dynamically Controlled Crystallization System

A detailed description of a DCCS and the means by which it dynamically controls protein crystallization is provided in U.S. Pat. No. 5,961,934, issued on Oct. 5, 1999, and entitled "Dynamically controlled crystallization method and apparatus and crystals obtained thereby," the contents of which are incorporated herein by reference in their entirety. Additional descriptions of various embodiments of a DCCS are provided in U.S. patent application Ser. No. 09/622,553 pending, of the same title, that was filed Aug. 18, 2000, as a continuation-in-part of International Patent Application No. PCT/US99/03515, for which the international filing date is Feb. 18, 1999. The contents of U.S. patent application Ser. No. 09/622,553 pending and of International Patent Application No. PCT/US99/03515 are incorporated herein by reference in their entirety.

As stated above, a DCCS unit employs a crystallization chamber that contains the protein in a buffered solution separated from the precipitating solution by a dialysis type membrane.

A computer-controlled mechanism gradually changes the precipitating solution strength in a very precisely controlled manner, thereby causing the protein to leave its solution, form aggregates, nucleate, and initiate crystal growth. In one embodiment, a stepper motor and lead screw drive a carriage that slides on two guide rods. The carriage is attached to the plungers of two syringes such that one syringe empties while the other one fills. Two plastic tubes lead from the syringes to the crystallization chamber-a small plastic housing containing the main mixing chamber, a cover which serves as the protein solution compartment, and various holes for attaching probes to monitor conductivity, pH, and temperature. A printed circuit board containing the electronics is the final element. This provides motor control and interface output for the various probes in the case of the flight unit. The system is packaged on a main plate and sealed by use of a gasket cover, which results in a sealed plug-in module. For the laboratory version, the elements are mounted on an open chassis. To complete the system, a standard personal or laptop computer is required. The computer and its software offer a complete capability to operate, control and monitor the crystallization process.

DCCS with Voltage-gated Membrane

In a preferred embodiment, the DCCS crystallization chamber employs dialysis membrane to separate the compartment containing the protein to be crystallized from the compartment containing the reagent solution comprising the precipitant. Crystallization salts and buffer whose macromolecular size is smaller than the pore size of the dialyses membrane can enter the protein compartment and bring the protein solution to its crystallization point. In an alternative embodiment, the dialysis membrane is replaced by a voltage-gated membrane, the purpose of which is to have the properties of a dialyses membrane whose pore size can be electrically varied. Difficulties in developing a new voltage-gated membrane suitable for use in a DCCS have been overcome, and a new type of membrane has-recently been tested successfully.

The DCCS was developed to measure and control key parameters that effect the protein crystallization process. Dynamic control provides the following features:

1. The crystallization process can be started at will.
2. Conditions that are important for protein crystal growth (pH, temperature, conductivity, time, etc.) can be monitored.
3. Decisions can be made based upon these parameters.
4. These conditions can be very precisely controlled at any time during the crystallization process.
5. The crystallization process can be stopped when desired.
6. The process can be reversed if so desired.

Crystallizing Proteins in Microgravity with a DCCS

The operation of the DCCS is compatible with the microgravity environment; a complex set of variables in the process of crystal growth can be rigorously examined, manipulated and controlled in identical ground and space systems. The DCCS has real time remote-controlled operative capabilities. It is designed for flights aboard the Space Shuttle and the International Space Station, where use of this invention conserves both proteins and valuable astronaut time.

It is designed to be operated on the ground or in space, and to control crystallization parameters so that differences in the crystals grown in the DCCS in these two environments are predominantly due to the presence or absence of gravity.

On the Space Shuttle

To date four flight systems (and their ground counterparts) were flown successfully on STS 95. This was followed by a successful flight on STS 93 where each system contained four additional crystallization chambers permitting a total of 20 flight and 20 ground crystallizations.

On the International Space Station (ISS)

From the outset the DCCS was designed to be used for crystallizing proteins on the International Space Station. Its initial usage on the shuttle was to gain experience that would be used in producing the space station version of the DCCS. The DCCS for the Space Station:

1. Is able to perform multiple crystallizations concurrently.
2. The multiple crystallizations are capable of varying the crystallization parameters in a "matrix" like manner. For example, if a precipitating salt has two components (e.g. sodium chloride and ammonium sulfate) a screen could be set up where each component would be varied independently.
3. The system is compatible with existing and planned Space Station (and Shuttle) Refrigerator/Incubator systems (CRIM, NGTC, BioServe Isothermal Containment Modules (ICM), and the SHOT thermal carrier fleet) as well as other planned systems (e.g. X-ray crystallography facilities).
4. Recognizing that there will be cases where DCCS units will be in a Refrigerator/Incubator system with other systems, the DCCS for the space station employs interfaces that are sufficiently defined so as to preclude compatibility problems.
5. The system is compatible with the Express Rack logistic requirements.
6. The individual DCCS crystallizations will be able to be controlled and monitored for periods of time ranging from days to years. Similar to the earlier systems, each system for the space station is able to be monitored and controlled by a P. I. by using a laptop computer and the internet.

Growing Crystals in a Magnetic Field/force Environment

X-ray topography studies conducted to date show that protein crystals grown in microgravity have a discernable structural difference from the earth-based crystals. This observation is consistent with a number of similar experiments by independent groups on different shuttle flights involved with micro-gravity crystal growth. The reduction of sedimentation and convection are generally considered as positive elements in the growth of high quality crystals. Similar benefits resulting in improved crystal quality can be obtained by growing protein crystals in a magnetic field that causes the protein molecules to experience reduced $g_{eff}$.

The concept of using high magnetic fields for micro-gravity studies was first articulated by Beaugnon and Tournier (1991) who levitated bismuth, antimony, graphite, and other organic solids and liquids. There are, however, some fundamental differences in the mechanisms which lead to micro-gravity in a shuttle experiment and the $g_{eff}=0$ condition in our field gradient environment. In earth orbit (shuttle), the effects are only gravitational and kinematic in origin: the earth's gravitational centripetal acceleration ($gm/r^2$) is balanced by the orbital centrifugal acceleration ($v^2/r$). This balance only involves consideration of the inertial mass of the material, and Newton's law (F=ma). At the atomic level, both the electrons and the nucleus have the same balance, since the mass of the orbiting material "drops out" of the balance equation, i.e. the condition depends only on velocity and orbit radius. Magnetic levitation is distinguished from this as follows: in diamagnetism, the magnetic force is primarily a result of the quantum mechanical action of the magnetic field on the electrons. There is also an interaction on the nucleus (hence the phenomena of nuclear magnetic resonance, nuclear magnetism, etc.), but the resulting forces are orders of magnitude smaller. It is primarily the electrons that transmit the magnetic force in a material, and due to the very high stability of the atomic structure the nuclei "follow along." The opposing gravitational acceleration, of course, still acts on all masses in the nucleus.

A specific diamagnetic substance (cell, macromolecular structure, saline solution, plastic, etc.) will experience a magnetic force which exactly cancels its gravitational weight at a particular point inside a high field magnet. Hence the effective gravity ($g_{eff}$) is zero at this point.

Figure 2:
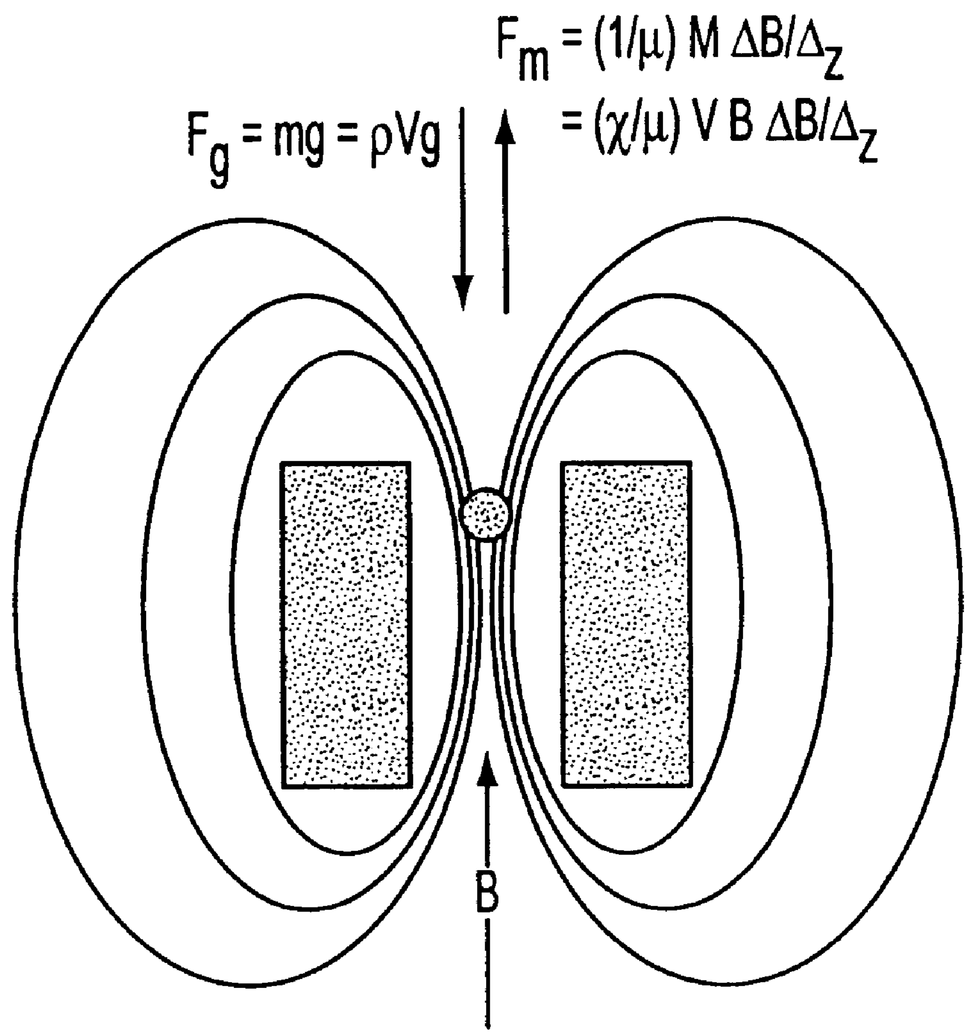
FIG. 2—Concept of Magnetic Levitation: Gravitational and diamagnetic forces balance somewhere above the center of the high field magnet since the gradient of the field is essential to provide a net diamagnetic force. The degree to which a substance is diamagnetic is given by the magnetic susceptibility constant $\chi$ and the opposing weight of the substance is governed by its density $\rho$.

At other points along the central axis of the magnet, which is oriented vertically, the diamagnetic force, which is always in the vertical direction, and which always points AWAY from the geometrical center of the magnet, will vary with distance. Hence the effective gravity of a substance will also vary with vertical distance. FIG. 2 indicates that the effective gravity may be zero, large, and downwards or upwards as the position varies.

A preferred embodiment of the present invention is to position a stack of up to 20 crystallization chambers along the vertical axis of the magnet, inside its hollow bore, with one of the chambers at the position of zero effective gravity ($g_{eff}$), and the other chambers strategically positioned below this chamber so that one cell is at the center of the magnet, and one chamber is below the center of the magnet. Positions of crystallization cells within the bore of a 33 tesla magnet are shown schematically in FIG. 3*b*. Effective gravitational acceleration $g_{eff}$ at various positions within the bore of the magnet is shown graphically in FIG. 3*a*. The center chamber will experience ONLY the magnetic field, and no magnetic force, and hence only the Earth's gravitational force. The lower cell will experience an effective gravity TWICE that of the earth's gravity. The result of the method is that protein crystals will be grown under a variety of effective gravity conditions in the crystallization cells within the bore of the magnet.

The apparatus which holds the chambers in position, and the bodies of the chamber themselves will not necessarily be "levitating"—the practical effect is that the positions of the very much smaller volumes of the chambers and their solutions (of order 1 $mm^3$)will be accurately placed for specific values of the effective gravity.

The low gravity-levitation environment produced by a resistive magnet has some important differences from the microgravity environment of the Space Shuttle. In the Shuttle the effect of micro-gravity is due to the effective "free fall" condition due to the constant radius orbit around the earth. In the magnetic force/gradient situation, the magnetic force balances the gravitational force only at one point. For objects as large as a golf ball, there will be as much as 10% difference between the magnetic and gravitational forces between the top and bottom of the object, although the total average force is zero. The smaller the object, the closer one is to the zero gravity condition in the case of magnetic levitation.

An associated consideration is that, since the diamagnetic force is related to the diamagnetic susceptibility/density ratio, the position of, for instance, zero gravity will differ in subtle ways between the solution and the cells in the solution.

A major difference is the presence of the magnetic field in magnetic levitation. FIG. 3*c* shows the value of the magnetic field along the axis of a 33 T magnet. It is maximum at the center where the diamagnetic force is zero, and smaller at the points where the magnetic forces either balance or add to the gravitational force. But on average, it is about 15 T.

An important point is that for asymmetric objects such as globular proteins, there will be an orientation effect which tries to align the cells in a particular direction in solution. The ability of macromolecules to orient in an applied magnetic field should be enhanced since the alignment process does not have to compete with these disordering effects. As discussed above, although the shape anisotropy may be small, in the case where $g_{eff}$ is nearly zero, the effects of magnetic alignment will be more pronounced. This, coupled with fields as high as about 30 T, will make the issue of magnetic field effects on growth more definitive. Whether this has a positive effect on protein crystallization has not yet been determined. The use of x-ray topographic analysis to characterize the quality of crystals of a given protein grown under various magnetic field conditions permits optimization of conditions of magnetic field and $g_{eff}$ for giving the most perfect crystals suitable for structure analysis by x-ray diffractometry.

The position where a particular material will "levitate" depends on its density and susceptibility. The growth chambers are made of plastic (perspex) with rubber o-rings (held together with nylon screws) and the protein solvents are between 40 to 70% NaCl in water. There is no metal in the crystallization chamber design. All of the materials to be placed in the magnet bore are comparable in density and susceptibility, to avoid detrimental inhomogeneities in the magnetic field or in the diamagnetic force gradient. However, care must be taken to accurately determine the precise effective g-value for any one substance.

The parameters of the magnetic field shown in FIGS. 3*a* and 3*c* have been computed for the magnet at full field (33 T), in order to show that $g_{eff}$ values ranging from zero to 6 g are accessible in high fields. Note that FIG. 3*a* shows that there are two $g_{eff}=0$ locations. S is a stable point where objects will "float", and U is an unstable point where the object will fall. The maximum amplitude in $g_{eff}$ shown in FIG. 3*a* will decrease as the maximum field decreases until at some point, around 16 T, $g_{eff}$ will always be positive; however, the shape of the $g_{eff}$ profile vs. height will not change. At 16 T, protein crystallization can be carried out at $g_{eff}$ values in the range of from zero to 2 g.

A preferred method for maintaining a controlled temperature in the crystallization chambers within the bore of the magnet comprises blowing air of selected temperature through the bore, thereby creating an air flow that raises the temperature in the bore to the desired temperature.

Practicing the Invention

The present invention provides a method for optimizing the conditions used for growing crystals of a protein. In general, the method comprises the steps of:

a) Growing a plurality of crystals of the protein under a plurality of different sets of predetermined conditions which preferably differ from one another in the value of at least one parameter selected from the group consisting of the type of precipitant, the concentration of precipitant, conductivity, pH, temperature, and $g_{eff}$ in the crystallization chamber over the course of crystallization.

b) Generating x-ray topographic images of the protein crystals.

c) Determining from the topographic images which of the sets of predetermined conditions tested produces the crystals having the fewest crystal defects. Crystal defects that can be detected in the x-ray topographic images include dislocations, variations in lattice orientation, lattice strains, stacking faults, inclusions, voids, impurity, concentration variations, and multiple sites of nucleation.

d) Selecting one or more "new" sets of predetermined crystal-growing conditions that are based on, but are different in at least one parameter from, the sets of conditions found in step c).

e) Growing one or more protein crystals under the "new" sets of predetermined crystal-growing conditions.

f) Generating x-ray topographic images of said protein crystals, and g) determining from said topographic images which of the "new" sets of predetermined conditions, if any, produce crystals having fewer crystal defects than the sets of predetermined conditions on which the "new" sets of conditions are based.

h) The set of steps d) through g) is then iteratively repeated until a set of predetermined crystal-growing conditions providing crystals of satisfactory quality is obtained, or until performing steps d) through g) fails to provide improvement in crystal quality. Each time the steps are repeated, the "new" sets of predetermined conditions selected for step d) are based on the most recently identified sets of conditions that are found in step g) to produce crystals having the fewest crystal defects.

In a preferred embodiment of the method described above, at least one and preferably all of the protein crystals grown in either of steps a) and e), preferably in both, are grown in a dynamically controlled crystallization system.

While a method in which steps d) through g) are iteratively repeated is preferred, the present invention can be practiced successfully by carrying out only the first three steps. In this embodiment, conditions for growing crystals of a protein are optimized by:

a) growing a plurality of crystals of the protein under a various different sets of predetermined conditions;

b) generating x-ray topographic images of the protein crystals; and c) determining from the topographic images which of the sets of predetermined conditions produce the crystals having the fewest defects.

As with the longer, iterative method, it is a preferred embodiment of the method that at least one and preferably all of the protein crystals grown in step a) are grown in a dynamically controlled crystallization system.

As discussed above, there is evidence that crystals grown under at least some conditions of altered effective gravity ($g_{eff}$) are of better quality—have fewer defects—than crystals grown at gravity at the earth's surface. The present invention can be used to identify conditions of altered effective gravity ($g_{eff}$) causing improved protein crystal growth. This is done by growing crystals of a protein under conditions in which $g_{eff}$ is varied, generating x-ray topographic images of the protein crystals, and determining from the topographic images the $g_{eff}$ at which the crystals having the fewest crystal defects are grown. It is preferable to practice this method by using a set of crystal-growing conditions that is the same for each crystal, but for the differences in the $g_{eff}$; however, improved crystal-growing conditions at an altered $g_{eff}$ can also be identified by using the above method in which one or more crystallization parameters in addition to $g_{eff}$ is varied.

In the preferred method, the protein crystals are grown at effective gravity $g_{eff}$ that is less than gravity at the earth's surface. This could be done by growing the protein crystals in space. Alternatively, this could be done by growing the protein crystals in a magnetic field that causes the protein molecules in the crystals to experience an effective gravitational field that is less than the gravitational field at the earth's surface. The present invention also operates successfully when one or more protein crystals are at effective gravity $g_{eff}$ that is greater than gravity at the earth's surface; e.g., in a centrifuge, or in a magnetic field that causes the protein molecules in the crystal to experience an effective gravitational field that is greater than the gravitational field at the earth's surface.

EXAMPLE

X-ray Topographic Analysis of Protein Crystals Grown on Earth and in Space

Methods and Materials

Ribonuclease S (Rnase S) enzyme (bovine) was purchased from Sigma (Wyckoff, 1967). The protein was dissolved to a concentration of 24 mg/ml in a solution of 25% saturated ammonium sulfate, 25% saturated sodium chloride (NaCl), and 0.1 M sodium acetate, pH 5.0, and then dialyzed against the same solution overnight. Thus prepared, the protein was frozen in 1 ml aliquots and thawed as needed.

To crystallize the protein from this starting condition, the NaCl level was raised by dialysis while the other parameters were kept constant, using a dynamically controlled crystallization system. The dialysis arrangement features a 50 microliter protein chamber capped by 10,000 MW cutoff dialysis membrane (Spectrum). Across the membrane is a 1 ml dialysate reservoir with input and output ducts so that the NaCl concentration in the dialysate can be dynamically controlled. Flow into and out of the reservoir is controlled by software through a motor and syringe interface. The reservoir is also equipped with probes for temperature, pH, and conductivity. All crystallization was at 24° C. Crystallization generally occurs when the sodium chloride level reaches 47–52% saturation.

In preparation for the STS-95 mission of space shuttle Discovery, four dialysis units were loaded with protein and with target dialysate solutions at NaCl concentrations of 47%, 50%, 53%, and 53%, respectively. Four identical units were also loaded with 47%, 47%, 50% and 53% NaCl solutions to remain on the ground and serve as controls. In all cases, the initial solution in the reservoir was given a NaCl level of 35%. The mission duration was 10 days. The dynamic control of the units was programmed to pump 10 ml of the target solution into the dialysate reservoir over the first 3.5 days of the mission. For the remaining flight time, the NaCl levels would continue to equilibrate and the crystals would grow.

After the mission, the crystals were first counted through the membrane using a microscope, and photographed through the dialysis membrane with a Nikon FX camera, while remaining in their growth environment. This allows comparison of where in the chamber they grew and their appearance before being removed. Next, the crystals were removed from the original protein crystallization chamber and placed in artificial mother liquor in hanging drops. The mother liquor solution consisted of 60% sodium chloride, 25% ammonium sulfate and 0.1 M sodium acetate. Crystals that were free floating in the growth chamber were simply inverted onto a coverslide and poured out of the chamber. However, those that had grown stuck to the various walls of the chamber and to the membrane had to be gently detached from the surface with a fiber loop and physically moved into hanging drops. At this point the crystal sizes were measured using a microscope and morphology and defect observations were made. Photographs were taken again using the same camera while in this hanging drop environment; these photos were later transferred into digital image files. Once well-documented on film and stabilized in solution, the crystals were mounted in 1.0 mm, siliconized glass capillaries for X-ray diffraction analysis. Diffraction analysis, using a rotating anode X-ray source, utilized the DENZO (Otwinowski, 1997) package for indexing the pattern, and annular densitometric integration for resolution comparison. X-ray topographic analysis was conducted at NIST beamline (X-23A3) of the National Synchrotron Light Source at Brookhaven National Laboratory where selected reflections were imaged and examined at high magnification.

Results

Rnase S crystals grew in all eight units (four flight and four ground). The number and sizes of crystals in both environments, as indicated in Table 1, followed the normal trend: the higher the precipitant concentration the more crystals and the smaller the crystals. Crystals grown in space were approximately equal in size to their ground counterparts. The crystal yields (fraction of protein that was actually incorporated into crystals) were roughly similar. The principal difference was manifest in the removal process. In the ground units, most of the crystals had grown adhering to the walls and membrane of the chamber and were difficult to remove. In all four ground units, about 80% of the crystals were stuck and, in particular, the biggest and best were the most difficult to harvest. The crystals that were grown in microgravity were about 80% loose and free-floating in their growth solution. These crystals could be poured out of their chambers with minimal handling.

X-ray Topography

As an initial study of the crystals grown on STS-95, 10 candidate crystals were identified, 5 earth-grown and 5 space-grown. These crystals were crystallographically oriented with respect to their capillary axis using data from the previous diffraction analysis. Topographs were recorded using the second order (006) diffraction from each of the 10 crystals. Examination of the topographs indicates that the space-grown crystals are of higher crystal perfection than the ground grown crystals. This is demonstrated in the topographs shown in FIGS. 4A–4K. The topographs of the space grown crystals (FIGS. 4A–4E) have a more uniform, sharper diffracted image. The more intensely diffracting regions have symmetry consistent with the crystallographic symmetry of the crystal. In several cases, observation of the diffracted image in real-time showed a central diffracting region which then migrated to the edges of the crystal as the Bragg angle was changed. This observation is consistent with a central nucleation and subsequent homogeneous growth. The space-grown crystals have clearly defined edges and no subgrain structure. On the other hand, the earth-grown crystals (FIGS. 4F–4K) have a much more "diffuse" or "fuzzy" quality, typical of a higher defect density. The crystal edges are less well defined and there is no consistent symmetry of the images. As shown in FIGS. 4I and 4K, crystal 8BA1 is in fact two separate grains with a misorientation of 220 seconds of arc between the grains.

TABLE I

Crystal Results.

| Unit | Location Of Growth | [NaCl] (%) | No. of Crystals | Avg. Size (mm) | Largest Size (mm) | Yield (%) |
|---|---|---|---|---|---|---|
| F00 | Space | 47 | 3 | 1.2 | 1.6 | 8 |
| F01 | Space | 50 | 6 | 1.15 | 1.3 | 14 |
| F02 | Space | 53 | 35 | 0.6 | 0.7 | 11 |
| F03 | Space | 53 | 30 | 0.55 | 0.7 | 7 |
| G00 | Incubator | 47 | 1 | 1.5 | 1.5 | 5 |
| G01 | Incubator | 50 | 4 | 1.2 | 1.4 | 10 |
| G02 | Incubator | 53 | 40 | 0.55 | 0.6 | 10 |
| G04 | Incubator | 47 | 1 | 1.4 | 1.4 | 4 |

Figures 5, 6:
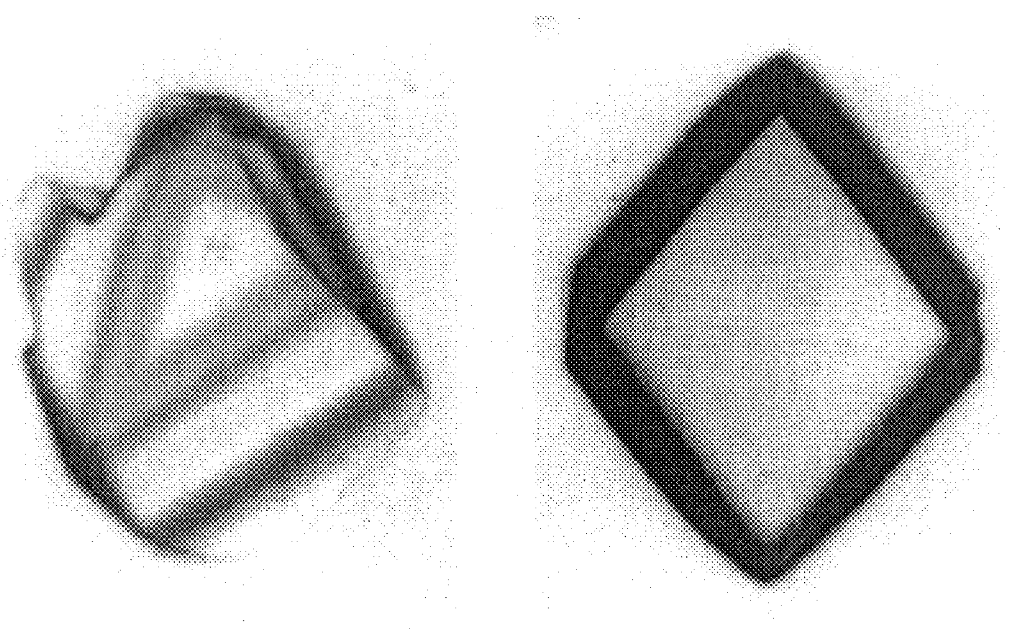
FIG. 5—The crystal shown is 8BB6—an earth crystal; its longest dimension is 0.7 mm. The color stripes are optical artifacts due to polarized light and the specific viewing angle (birefringence effects). This crystal has some broken looking faces, because it grew in a sedimented cluster with other crystals. This was a common problem that caused earth crystals to have imperfect shapes. They often grew attached to surfaces making harvesting difficult.
FIG. 6—The crystal shown is 9AC4—a space crystal; its longest dimension is 1.1 mm. This is the typical shape for all earth/space crystals. Except as noted, there was no significant difference in the visual appearance.

Although the crystals grown on earth and in space were generally similar in appearance there were some differences, as seen in FIGS. 5 and 6. Crystals from both environments typically had six well-developed faces, with the two tips slightly rounded. Because the earth-grown crystals were more often stuck to the wall, they tended to have less complete, less perfect shapes. The space-grown crystals occasionally had minor damage to edges and tips, but not enough to significantly interfere with their analysis.

Diffraction Analysis

Diffraction analysis at the level of routine indexing and resolution measurement was carried out for a selected subset of six earth-grown and six space-grown crystals. The crystals were selected to be of matching size, and were all over 0.5 mm. No significant difference was observed in this sample, where all the crystals indexed well and diffracted beyond 1.6 angstrom resolution, as is typical for Rnase S crystals. These observations demonstrate that monochromatic x-ray topography using a synchrotron radiation beam is sufficiently nondestructive to be used to analyze protein crystals.

Of great importance, these observations demonstrate that neither visual inspection nor diffraction analysis could identify the crystals having the fewest crystallographic defects. However, x-ray topographic analysis readily identified the space-grown crystals as having fewer defects than those grown on earth. One can "solve" a protein structure with a crystal having defects, but that solution will not reflect the true protein structure as accurately or precisely as will the solution from a crystal having fewer defects. The benefits of the invention are therefore enormous, because a drug discovery research program costing millions of dollars may be wasted if based on a less-accurate structure.

All publications and patents mentioned in the above specification, U.S. provisional application No. 60/169,943, filed Dec. 10, 1999, entitled "Molecular Crystallization With Magnetic Levitation," are incorporated herein by reference in their entirety.

Various modifications and variations of the described method and system of the invention will be apparent to those skilled in the art without departing from the scope and spirit of the invention.

REFERENCES

Beaugnon and Tournier, Nature 349:470 (1991).

Bowen, D. Keith and Tanner. B. K., *High Resolution X-ray Diffractometry and Topography,* Taylor and Frances, Ltd., London, 1998.

Cullity, B. D., *Elements of X-ray Diffraction.* Reading, 1967.

Tanner, B. K., *X-Ray Diffraction Topography,* Pergamon Press, Oxford, 1976.

Otwinowski, Z. and Minor. W., *Processing of X-ray Diffraction Data Collected in Oscillation Mode,* Methods in Enzymology, Volume 276: Macromolecular Crystallography, part A, pages 307–326, Carter, C. M., and Sweet, Eds., Academic Press, 1997.

Wyckoff. HM. et al., J Biol. Chem. 242:3749–373 (1967).

We claim:

1. A method for identifying conditions of altered effective gravity ($g_{eff}$) causing improved protein crystal growth comprising:

growing a crystal of a protein under a set of known conditions in a first $g_{eff}$;

growing one or more crystals of said protein under one or more sets of known conditions for which $g_{eff}$ is different from said first $g_{eff}$;

generating x-ray topographic images of said protein crystal grown in said first $g_{eff}$ and said one or more protein crystals grown in $g_{eff}$ that is different from said first $g_{eff}$; and determining from said topographic images the $g_{eff}$ at which the crystal having the fewest crystal defects is grown.

2. The method of claim 1 wherein all of said sets of known crystal-growing conditions are identical except for the differences in said $g_{eff}$ conditions.

3. The method of claim 1 wherein said crystal defects comprise at least one defect selected from the group consisting of dislocation, variations in lattice orientation, lattice strains, stacking faults, inclusions, voids, impurity concentration variations, and multiple sites of nucleation.

4. The method of claim 1 wherein at least one of said protein crystals is grown at effective gravity $g_{eff}$ that is less than gravity at the earth's surface.

5. The method of claim 4, wherein at least one of said protein crystals is grown in space.

6. The method of claim 4 wherein at least one of said protein crystals is grown in a magnetic field that causes the protein molecules in said at least one crystal to experience an effective gravitational field that is less than the gravitational field at the earth's surface.

7. The method of claim 1 wherein at least one of said protein crystals is grown at effective gravity $g_{eff}$ that is greater than gravity at the earth's surface.

8. The method of claim 1, further comprising subjecting the crystal having the fewest defects to x-ray crystallography to solve the structure of the crystallized protein.

9. The method of claim 8, wherein the structure being obtained is more accurate than the structure that would be obtained from a crystal having more defects.

10. A method for optimizing conditions for growing a crystal of a protein comprising:

a) growing a-plurality of crystals of said protein under a plurality of different sets of known conditions in at least one dynamically controlled crystallization system;

b) generating x-ray topographic images of said protein crystals; and c) determining from said topographic images which one or more of said sets of known conditions produce crystals having the fewest crystal defects.

11. The method of claim 10 wherein said different sets of known crystal-growing conditions differ from one another in the value of at least one parameter selected from the group consisting of the type of precipitant, the concentration of precipitant, conductivity, pH, temperature, magnetic field strength, and $g_{eff}$ in the crystallization chamber over the course of crystallization.

12. The method of claim 10 wherein at least one of said protein crystals is grown at effective gravity $g_{eff}$ that is less than gravity at the earth's surface.

13. The method of claim 12 wherein at least one of said protein crystals is grown in space.

14. The method of claim 12 wherein at least one of said protein crystals is grown in a magnetic field that causes the protein molecules in said at least one crystal to experience an effective gravitational field that is less than the gravitational field at the earth's surface.

15. The method of claim 10 wherein at least one of said protein crystals is grown at effective gravity $g_{eff}$ that is greater than gravity at the earth's surface.

16. The method of claim 10 wherein said crystal defects comprise at least one defect selected from the group consisting of dislocation, variations in lattice orientation, lattice strains, stacking faults, inclusions, voids, impurity concentration variations, and multiple sites of nucleation.

17. The method of claim 10, further comprising subjecting the crystal having the fewest defects to x-ray crystallography to solve the structure of the crystallized protein.

18. The method of claim 17, wherein the structure being obtained is more accurate than the structure that would be obtained from a crystal having more defects.

19. The method of claim 10, further comprising the steps:

d) selecting one or more new sets of known crystal-growing conditions based on, but different from, said one or more of said sets of known conditions found in step c);

e) growing one or more protein crystals under said one or more new sets of known crystal-growing conditions;

f) generating x-ray topographic images of said protein crystals; and g) determining from said topographic images which of the new sets of known conditions, if any, produce crystals having fewer crystal defects than said one or more of said sets of known conditions on which said new sets of conditions are based; and h) if better crystal quality is needed, iteratively repeating steps d) through g), each time basing the new sets of known conditions selected for step d) on the sets of conditions that are found in step g) to produce crystals having the fewest crystal defects, until a set of known crystal-growing conditions providing crystals of satisfactory quality for solving the protein structure by x-ray crystallography is obtained, or until steps d) through g) fail to provide further improvement in crystal quality.

20. A method for optimizing conditions for growing crystals of a protein comprising:

a) growing a plurality of crystals of said protein under a plurality of different sets of known conditions;

b) generating x-ray topographic images of said protein crystals; and c) identifying from said topographic images one or more of said sets of known conditions that produce crystals having the fewest crystal defects;

d) selecting one or more new sets of known crystal-growing conditions based on, but different from, said one or more of said sets of known conditions found in step c);

e) growing one or more protein crystals under said one or more new sets of known crystal-growing conditions;

f) generating x-ray topographic images of said protein crystals; and g) determining from said topographic images which of the new sets of known conditions, if any, produce crystals having fewer crystal defects than said one or more sets of known conditions on which said new sets of conditions are based; and h) if better crystal quality is needed, iteratively repeating steps d) through g), each time basing the new sets of known conditions selected for step d) on the sets of conditions that are found in step g) to produce crystals having the fewest crystal defects, until a set of known crystal-growing conditions providing crystals of satisfactory quality for solving the protein structure by x-ray crystallography is obtained, or until steps d) through g) fail to provide further improvement in crystal quality.

21. The method of claim 20 wherein at least one of steps a) and e) comprises growing at least one protein crystal under a set of known crystal-growing conditions in a dynamically controlled crystallization system.

22. The method of claim 20 wherein said different sets of known crystal-growing conditions of steps a) and d) differ from one another in the value of at least one parameter selected from the group consisting of the type of precipitant, the concentration of precipitant, conductivity, pH, temperature, magnetic field strength, and $g_{eff}$ in the crystallization chamber over the course of crystallization.

23. The method of claim 20 wherein at least one of said protein crystals is grown at effective gravity $g_{eff}$ that is less than gravity at the earth's surface.

24. The method of claim 23 wherein at least one of said protein crystals is grown in space.

25. The method of claim 23 wherein at least one of said protein crystals is grown in a magnetic field that causes the protein molecules in said at least one crystal to experience an effective gravitational field that is less than the gravitational field at the earth's surface.

26. The method of claim 20 wherein at least one of said protein crystals is grown at effective gravity $g_{eff}$ that is greater than gravity at the earth's surface.

27. The method of claim 20 wherein said crystal defects comprise at least one defect selected from the group consisting of dislocation, variations in lattice orientation, lattice strains, stacking faults, inclusions, voids, impurity concentration variations, and multiple sites of nucleation.

28. A method for determining the structure of a protein, comprising:

(a) growing crystals of the protein under a variety of different crystal growth conditions, (b) conducting x-ray topography of the protein crystals, (c) identifying the protein crystal having the least defects, and (d) if the protein crystal is suitable, subjecting the selected protein crystal to structure analysis by x-ray crystallography.

29. The method of claim 28, further comprising after step (c), growing a second set of crystals of the protein under conditions different than in step (a), producing a protein crystal having fewer defects than the protein crystal of step (c), and being suitable for structure analysis by x-ray crystallography.

* * * * *